United States Patent [19]

Lesartre

[11] 4,321,563
[45] Mar. 23, 1982

[54] CIRCUIT FOR STABILIZING FREQUENCY OF FET OSCILLATOR AS OUTPUT POWER VARIES

[75] Inventor: Paul Lesartre, Brunoy, France

[73] Assignee: U.S. Philips Corporation, New York, N.Y.

[21] Appl. No.: 70,551

[22] Filed: Aug. 29, 1979

[30] Foreign Application Priority Data

Sep. 1, 1978 [FR] France .................................. 78 25304

[51] Int. Cl.³ ............................................ H03B 5/12
[52] U.S. Cl. .............................. 331/117 FE; 331/175; 331/185; 332/31 T
[58] Field of Search ................. 331/117 FE, 175, 182, 331/185, 186, 116 FE; 332/31 R, 31 T

[56] References Cited

U.S. PATENT DOCUMENTS 2,396,439  3/1946  Schlesinger ..................... 331/182 X
3,534,294  10/1970  Auer ............................. 331/117 FE

FOREIGN PATENT DOCUMENTS 2539368  3/1977  Fed. Rep. of Germany .

*Primary Examiner*—Siegfried H. Grimm
*Attorney, Agent, or Firm*—Bernard Franzblau

[57] ABSTRACT

A frequency stabilizing device for a FET high-frequency oscillator comprises means for coupling an automatic biasing circuit included in the source-ground connection of the oscillator to a drain voltage supply circuit included in the drain-ground connection of the oscillator to provide simultaneous and oppositely directed variations of the resistance of the automatic biasing circuit and of the value of the drain-ground voltage supplied by the drain voltage supply circuit. A variation of this device can serve as a modulation stage wherein the coupling means comprise a modulating circuit arranged to supply two branches in parallel, each branch comprising a series arrangement of a shaping circuit and an impedance-matching circuit and one of which constitutes the automatic biasing circuit and the other one the drain voltage supply circuit.

8 Claims, 4 Drawing Figures

CIRCUIT FOR STABILIZING FREQUENCY OF FET OSCILLATOR AS OUTPUT POWER VARIES

The present invention relates to a device for stabilizing the frequency of a high-frequency oscillator, more particularly an oscillator comprising a field effect transistor, and also relates to any oscillator of this type provided with such a device.

In the case where the field effect transistor oscillator is mounted so that bias is automatically obtained owing to the presence of a source resistor, a variation in the output power can be obtained by varying either the ohmic value of this source resistor or the value of the drain-ground supply voltage. However, such variations cause shifts of the operating points of the oscillator and, consequently, frequency variations, which has a negative effect on the stability desired for this type of equipment.

An object of the invention is to provide a frequency stabilizing device which makes it possible for the oscillator to show an excellent frequency stability over the whole dynamic range of its output power.

The invention therefore relates to a device for stabilizing the frequency of a high-frequency field effect transistor oscillator, characterized in that it comprises means for coupling an automatic biasing circuit included in the source-ground connection of the oscillator and a drain voltage supply circuit provided in the drain-ground connection of the oscillator. The purpose of the coupling means is to enable simultaneous and opposite variations of the ohmic value of the resistance of the automatic biasing circuit and of the value of the drain-ground voltage supplied by the drain polarizing circuit. The fact that there is such a coupling makes it indeed possible to extend the range over which the output power of the oscillator can vary to a considerable extent while reducing the relative frequency variation, thanks to the compensation effected between the frequency variations which are individually observed when either only the source resistance or only the drain-ground voltage is varied.

The proposed coupling means may either be an assembly of two potentiometers which are mechanically coupled and one of which is series-arranged in the automatic biasing circuit and the other one in the drain voltage supply circuit, or two resistance bridges which are placed respectively in the same manner and in which the resistors can be short-circuited or cut out individually by means of change-over switches connected to a control circuit. These change-over switches may, for example, be transistors (and the control circuit a pulse generating circuit) or, alternatively, photocouplers whose photoemissive element forms part of the control circuit.

The coupling means may, alternatively, consist of a modulation circuit arranged to feed two parallel branches, each branch comprising the series arrangement of a shaping circuit and an impedance-matching circuit, one branch constituting the automatic biasing circuit and the other branch the drain voltage supply circuit. Thus, it is possible to effect a modulation inside the oscillator, which has the advantage that the unilateral conductor and the external modulator, which are usually found in high-frequency emitters, can be omitted.

Further particulars and advantages of the invention will be more fully understood with reference to the following description when read in conjunction with the attached drawings which, by way of non-limitative example, show some embodiments of the invention and in which.

Figure 1:
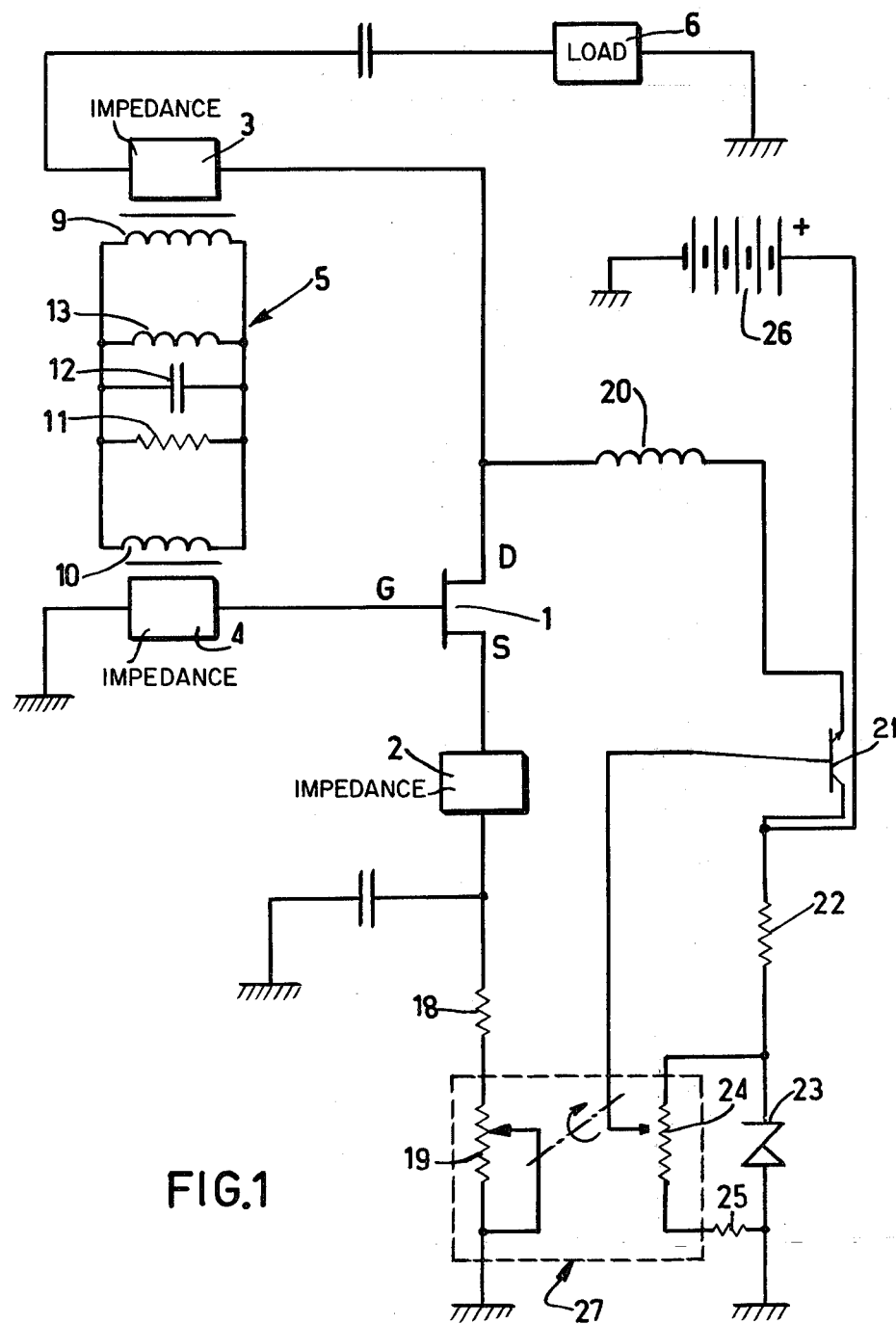
FIG. 1 shows a field effect transistor high-frequency oscillator provided with a frequency stabilizing device according to the invention.

The high-frequency oscillator shown in FIG. 1 comprises a field effect transistor 1, whose source, drain and gate terminals are indicated by the references S, D and G, impedances 2, 3 and 4 of the source, the drain and the gate, respectively, a resonant circuit 5 arranged in a drain-gate feedback circuit, an automatic gate-source biasing circuit, a drain voltage supply circuit and a load 6 (for example an aerial).

The resonant circuit 5 comprises, connected to the two coupling inductances 9 and 10, a resistor 11, a capacitor 12 and an inductance 13, arranged in parallel. The automatic biasing circuit comprises, between the impedance 2 and ground, a series arrangement of a resistor 18 and a potentiometer 19. The drain voltage supply circuit comprises, between the drain and ground, a series arrangement of an inductance 20, a transistor 21, a resistor 22 and a Zener diode 23. A potentiometer 24 and a resistor 25 are connected in parallel with the Zener diode. The collector of the transistor 21 is connected to the positive terminal of a voltage source 26.

The potentiometers 19 and 24 are mechanically coupled over their respective overall resistance ranges and constitute a coupling device 27. The coupling is realized in the manner shown in FIG. 1: a decreasing source resistance corresponds to an increasing drain-ground voltage. For example, the maximum power one wants to have at one's disposal at the oscillator output is obtained at a minimal source resistance and a maximum drain-ground voltage (which corresponds to the "highest" position of the sliding contact in FIG. 1).

With the above-described oscillator a certain variation of the source resistance or of the drain-ground supply voltage produces a variation of the oscillation frequency in a sense which is directly connected with the sense of this variation. When the coupling of these potentiometers 19 and 24 is realized in accordance with the invention, a satisfactory compensation of the frequency variations which are the result of each individual change in the position of the sliding contact of these potentiometers is obtained, and, consequently, a desired frequency stabilization is produced.

Figure 2:
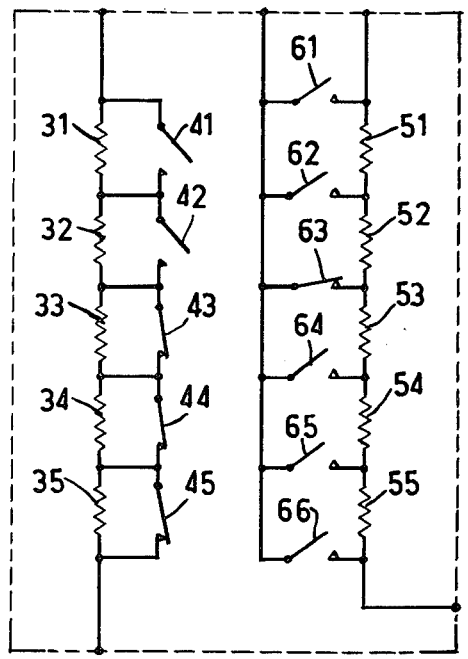
FIG. 2 shows a variant of the construction of the frequency stabilizing device.

In a variant of the construction of the device, shown in FIG. 2, the potentiometers are replaced by resistance bridges with which change-over switches are respectively associated. In that case the frequency stabilizing device comprises a resistance bridge 31 to 35, which is arranged in series in the automatic biasing circuit. Change-over switches 41 to 45, which are arranged in parallel with each of the resistors, are associated with the respective resistors. The frequency stabilizing device also comprises a series-arranged resistance bridge 51 to 55, which occupies exactly the same place as the potentiometer 24 in FIG. 1. Change-over switches 61 to 66, respectively, are associated with these resistors, the opening or closing of these switches enabling the selection of a variable voltage at the terminals of the resistors 51 to 55.

A control stage, not shown, controls the change-over of the switches to the appropriate position. For the coupling device shown in FIG. 2 the six positions of the change-over switches which can be obtained by means of the control stage are:

(a) switch 66 closed, switches 41 to 45 and 61 to 65 open;

(b) switches 45 and 65 closed, switches 41 to 44, 61 to 64 and 66 open;

(c) switches 44, 45 and 64 closed, switches 41 to 43, 61 to 63 and 65 and 66 open;

(d) switches 43 to 45 and 63 closed, switches 41 and 42, 61 and 62 and 64 to 66 open (positions shown in FIG. 2);

(e) switches 42 to 45 and 62 closed, switches 41, 61 and 63 to 66 open;

(f) switches 41 to 45 and 61 closed, switches 62 to 66 open (these positions correspond to the attainment of a maximum output power at the oscillator output).

It will be apparent that the present invention is not limited to the embodiments described above and shown in the drawings, on the basis of which it is possible to realize other embodiments within the scope of the invention.

Figure 3:
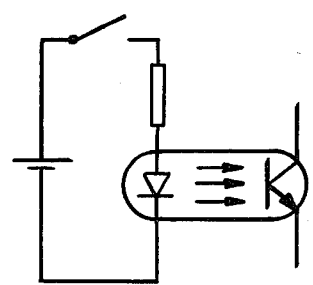
FIG. 3 shows a photocoupler.
Figure 4:
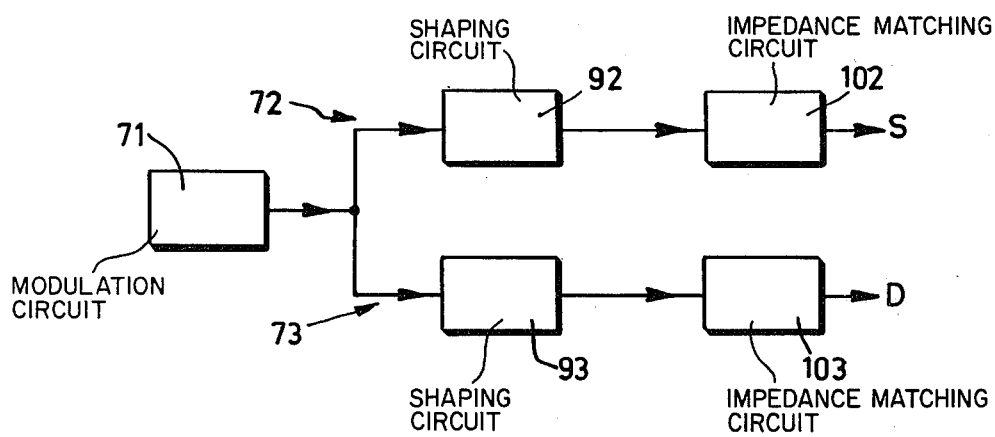
FIG. 4 shows a modulation stage for the automatic biasing voltage and the drain supply voltage.

The change-over switches which are schematically shown in FIG. 2 may be semiconductor elements such as transistors, or photocouplers if it is desired to provide electrical isolation between the control stage and the frequency stabilizing device. The photoemissive element of each photocoupler is then included in the control stage circuits, as shown schematically in FIG. 3.

Moreover, it is a known fact that the unilateral conductor in a transmitter comprising, in this order, a high-frequency oscillator, a unilateral conductor, a modulator and an aerial, is an expensive element and causes transmission losses, while the modulator is characterized by high insertion losses. These drawbacks can be avoided by dispensing with the unilateral conductor and the modulator and by using a frequency stabilizing device according to the invention as the modulator. In that case the frequency stabilizing devices comprises a modulation circuit 71 whose output is connected to the common terminal of the two parallel-arranged branches 72 and 73. The other terminal of one of the branches, in this example branch 72, is connected to the source terminal of the field effect transistor 1. The other terminal of the other branch, branch 73 in this example, is connected to the drain terminal of the transistor 1. Each one of these two branches 72 and 73 comprises a shaping circuit, 92 and 93, respectively, and an impedance matching circuit, 102 and 103, respectively.

Alternatively, the two branches 72 and 73 may be completely separate, one branch comprising a modulation circuit 71a, the other branch a modulation circuit 71b. Such a construction has the advantage that it is possible to obtain, by means of a proper choice of the circuit of each branch, an accurate compensation of the frequency variations which are individually observed during modification of only the source resistance or only the drain-ground voltage.

What is claimed is:

1. A frequency stabilized radio frequency oscillator comprising, a field effect transistor (FET) having drain, source and gate electrodes, an automatic biasing circuit connecting said FET source electrode to ground, a drain voltage supply circuit coupling the FET drain electrode to a source of supply voltage and to ground, a resonant circuit coupled to the FET gate electrode, and means for simultaneously varying in opposite sense a resistance in the automatic biasing circuit and the value of the drain-ground voltage set up by the drain voltage supply circuit.

2. An oscillator as claimed in claim 1 wherein said means for varying comprises an assembly of two mechanically coupled potentiometers one of which forms said resistance and is connected in series in the automatic biasing circuit of the oscillator and the other one of said potentiometers being connected in the drain voltage supply circuit.

3. An oscillator as claimed in claim 1 wherein said means for varying comprises a first plurality of resistors that form said resistance and are connected in series in the automatic biasing circuit of the oscillator together with a plurality of switches corresponding to said resistors and with an individual switch connected in parallel with its corresponding resistor, and a second plurality of resistors connected in the drain voltage supply circuit together with a second plurality of switches individually coupled to the resistors of the second plurality of resistors such that the value of the drain-ground voltage can be selectively varied as a function of the switch settings, said switches being part of a control circuit in which selected switches are activated so as to maintain a predetermined relationship therebetween such as to maintain the oscillator frequency stable as the output power of the oscillator varies as a function of the switch settings.

4. An oscillator as claimed in claim 3 wherein each switch comprises a photocoupler having a photoemissive element included in the control circuit and a photosensitive element operative as a switch.

5. A frequency stabilized oscillator comprising, a field effect transistor (FET) having drain, source and gate electrodes, a first variable impedance means connecting said FET source electrode to ground, a second variable impedance means connecting said FET drain electrode to ground, a source of DC supply voltage coupled to said second variable impedance means and to ground so that adjustment of the second variable impedance means varies the value of the drain-ground voltage, a resonant circuit coupling the FET drain and gate electrodes, and means for varying the oscillator output power including means for simultaneously varying the impedance of the first and second variable impedance means such that the impedance of the first variable impedance means is changed in opposite sense to the change in value of drain-ground voltage.

6. An oscillator as claimed in claim 5 wherein said first and second impedance means comprise first and second potentiometers connected in circuit between the source and drain electrodes and ground, respectively, and said simultaneous impedance varying means comprises a mechanical coupling between the wipers of said potentiometers.

7. An oscillator as claimed in claim 6 wherein said second variable impedance means includes a transistor connected in series with the second potentiometer between the FET drain electrode and ground, the DC voltage source is coupled between the transistor collector electrode and ground, and the transistor base electrode is connected to the wiper of the second potentiometer.

8. An oscillator as claimed in claim 5 wherein said first impedance means comprises a first group of resistors connected in series between the source electrode and ground and a first group of switches individually coupled to the first group of resistors so as to vary the source-ground resistance as a function of the switch settings, said second impedance means comprises a second group of resistors connected in series between the drain electrode and ground and a second group of switches individually coupled to the second group of resistors so as to vary the drain-ground voltage as a function of the settings of the second group of switches, and wherein said simultaneous varying means is arranged to activate selected switches of said first and second groups of switches in a predetermined relationship that varies the output power of the oscillator while maintaining the oscillator frequency stable.

* * * * *